US008446228B2

(12) United States Patent
Trotta (10) Patent No.: US 8,446,228 B2
(45) Date of Patent: May 21, 2013

(54) OSCILLATOR CIRCUIT (75) Inventor: Saverio Trotta, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 41 days.

(21) Appl. No.: 13/142,428

(22) PCT Filed: Jan. 5, 2009

(86) PCT No.: PCT/IB2009/050014
§ 371 (c)(1),
(2), (4) Date: Jun. 28, 2011

(87) PCT Pub. No.: WO2010/076670
PCT Pub. Date: Jul. 8, 2010

(65) Prior Publication Data
US 2011/0267147 A1 Nov. 3, 2011

(51) Int. Cl.
*H03B 5/18* (2006.01)
*H03B 9/14* (2006.01)

(52) U.S. Cl.
USPC ........... 331/107 SL; 330/55; 330/77; 330/81; 330/118; 330/119; 330/120; 330/121; 330/122; 330/255; 330/262; 331/108 R; 331/117 R; 331/117 FE; 331/167

(58) Field of Classification Search
USPC . 330/55, 77, 81, 118–122, 255, 262; 331/107 SL, 108 R, 117 R, 117 FE, 167
See application file for complete search history.

(56) References Cited

U.S. PATENT DOCUMENTS

| | | | |
|---|---|---|---|
| 5,418,500 A | 5/1995 | Igarashi | |
| 6,326,854 B1 * | 12/2001 | Nicholls et al. | ................. 331/56 |
| 7,323,947 B2 * | 1/2008 | Shigematsu | .............. 331/177 V |

(Continued)

FOREIGN PATENT DOCUMENTS

| | | |
|---|---|---|
| EP | 0527470 A1 | 2/1993 |
| WO | 2005/057790 A2 | 6/2005 |

OTHER PUBLICATIONS

Baeyens Y et al: "High-Power Submicron INP D-HBT Push-Push Oscillators Operating Up to 215 GHz" Compound Semiconductor Integrated Circuit Symposium, 2005, CSIC '05, IEEE Palm Springs, CA, USA, Oct. 30-Nov. 2, 2005, Piscataway, NJ, USA, IEEE, Oct. 30, 2005, pp. 208-211.
Laskin E. et al: "80/160-GHz Transceiver and 140-GHz Amplifier in SiGe Technology" Radio Frequency Integrated Circuits (RFIC) Symposium, 2007 IEEE, Jun. 3-5, 2007, Honolulu, HI, pp. 153-156.
International Search Report and Written Opinion correlating to PCT/IB2009/050014 dated Dec. 28, 2009.

(Continued)

*Primary Examiner* — Arnold Kinkead
*Assistant Examiner* — Richard Tan (57) ABSTRACT

An oscillator circuit comprises a push-push oscillator and a differential output, comprising a first and a second output circuit. The push-push oscillator has a first and a second branch. Each of the first and second branch comprises an own voltage divider branch of a common bridge circuit. Each of the first and second voltage divider branches comprises an own pair of micro-strip lines connected in series. Each of the first and second voltage divider branches has an own tap. Both taps are connected to each other by at least one of a first capacity and a micro-strip line. The differential output comprises a first and a second output terminal. The first output terminal is connected via the first output circuit to a first node. The second output terminal is connected via the second output circuit to a second node. Each of the first and second nodes of the push-push oscillator is a common node of both of the first and the second branches.

17 Claims, 10 Drawing Sheets

U.S. PATENT DOCUMENTS 7,629,859 B2 * 12/2009 Rai .............................. 331/167
2006/0049880 A1    3/2006 Rein et al.
2007/0182502 A1    8/2007 Shin et al.
2007/0182505 A1    8/2007 Fujita et al.

* cited by examiner

OSCILLATOR CIRCUIT

FIELD OF THE INVENTION

This invention in general relates to an oscillator circuit comprising a push-push oscillator.

BACKGROUND OF THE INVENTION

With voltage-controlled oscillators in automotive radar transceivers a low phase noise and a good performance over a desired temperature range is required. Generally, the phase noise of oscillators is dependent on current densities in the employed transistors and on the load seen by the oscillators which degrades the quality. Push-push topology is widely used to obtain high operating output oscillation frequency while the oscillator core is running at half or quarter of the output oscillation frequency. A drawback of this technology is that the output signal is single-ended, while a differential signal is needed to drive a power amplifier at very high output oscillation frequency, where the power amplifier design is fully differential.

SUMMARY OF THE INVENTION

The present invention provides an oscillator circuit as described in the accompanying claims. Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
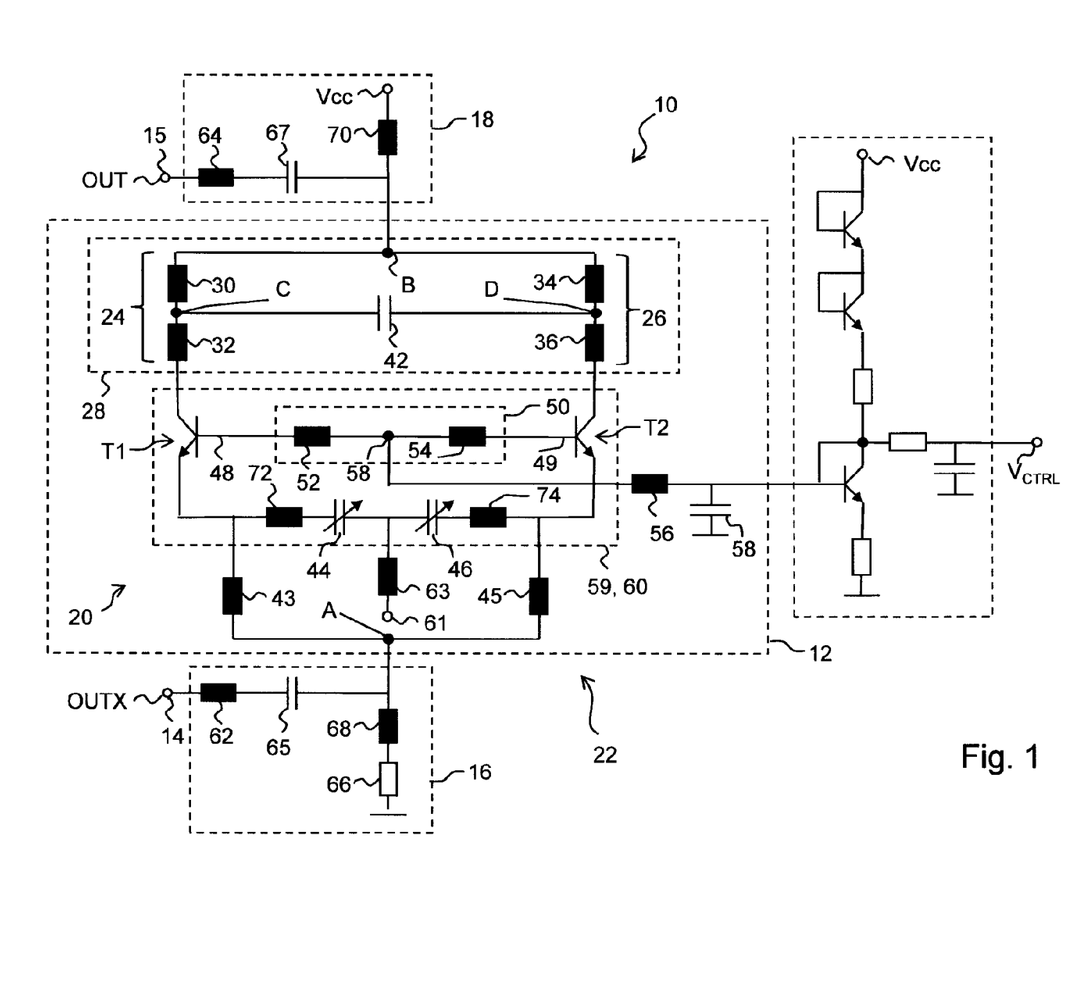
FIG. 1 shows schematically a circuit diagram of a differential push-push oscillator according to a first embodiment of the invention.
Figure 5:
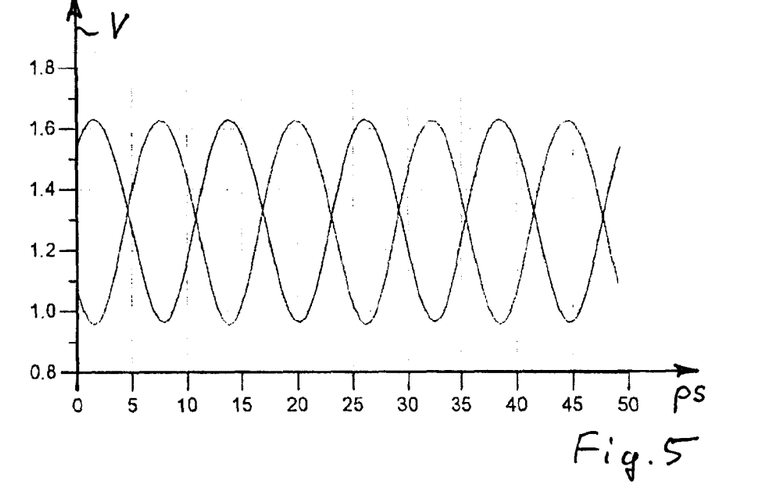
FIG. 5 shows for an example embodiment a simulation result of a differential output signal at the outputs OUT-OUTX at 81.29 GHz at 25° C.
Figure 6:
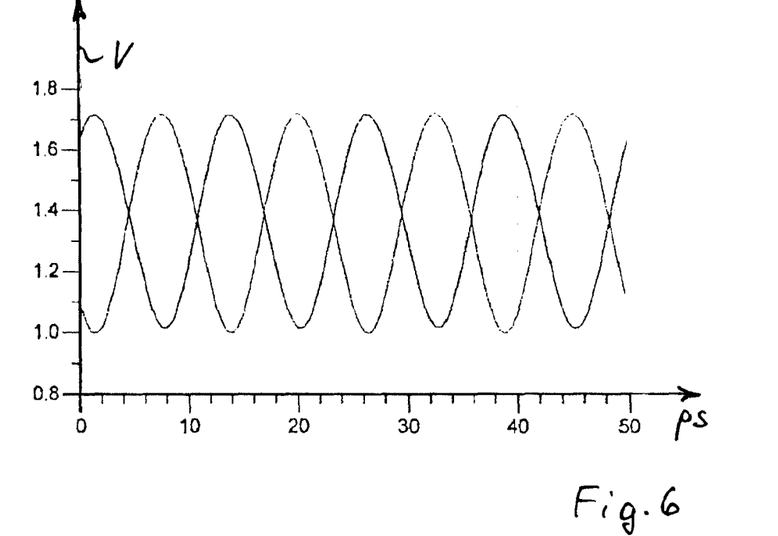
FIG. 6 shows for an example embodiment a simulation result of a differential output signal at the outputs OUT-OUTX at 81.29 GHz at 125° C.
Figure 7:
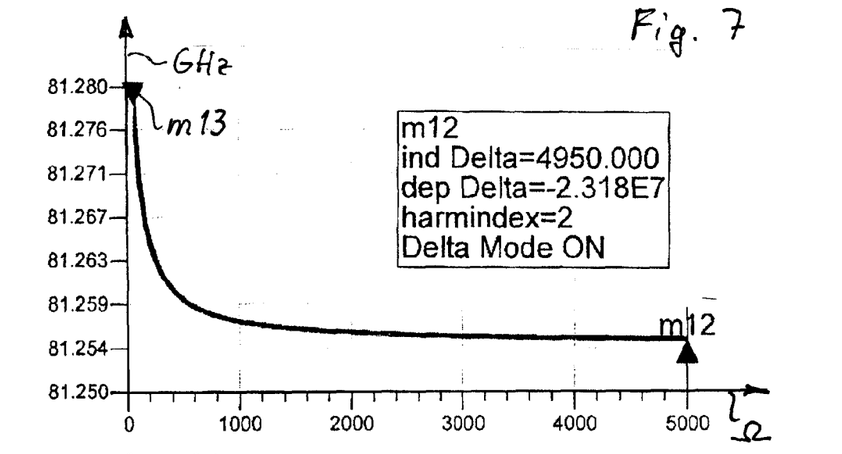
FIG. 7 shows for an example embodiment a simulation result of a dependency of the output oscillation frequency versus resistive load at 25° C.
Figure 8:
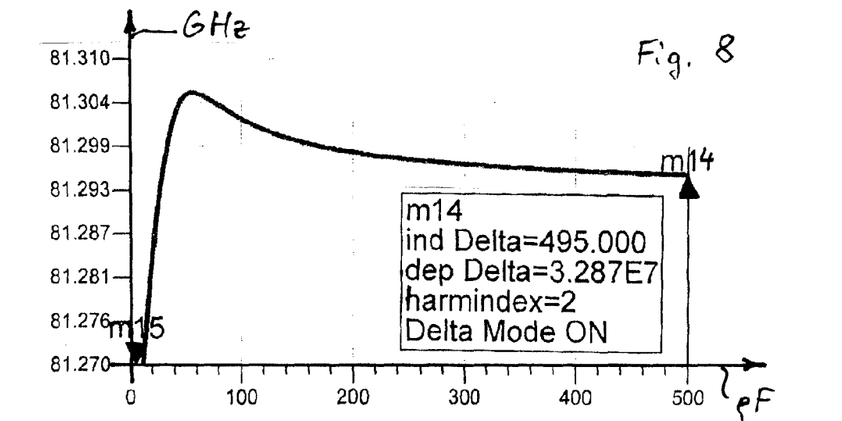
FIG. 8 shows for an example embodiment a simulation result of a dependency of the output oscillation frequency versus capacitive load at 25° C. with a resistive load of $R_{LOAD}=50\,\Omega$.
Figure 9:
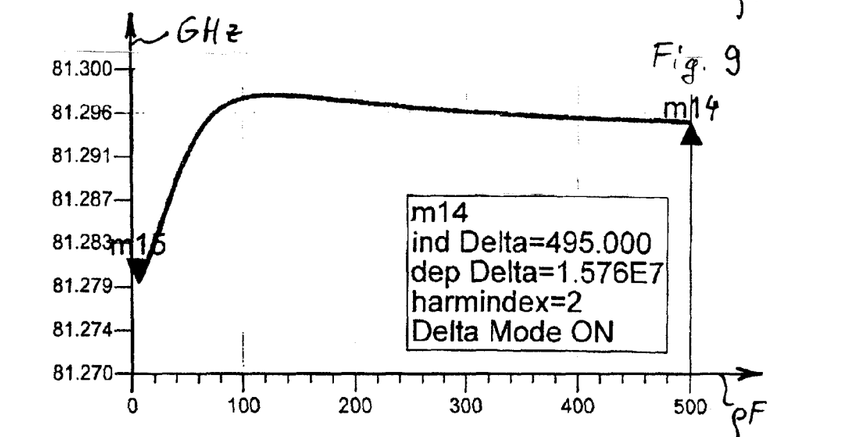
FIG. 9 shows for an example embodiment a simulation result of a dependency of the output oscillation frequency versus capacitive load at 25° C. with a resistive load of $R_{LOAD}=500\,\Omega$.

An oscillator circuit 10 according to FIG. 1 comprises a push-push oscillator 12, a differential output 14, 15, and a first 16 and second 18 output circuit. The push-push oscillator 12 has a first 20 and a second 22 branch. Each of the first 20 and second 22 branch comprises an own voltage divider branch 24, respectively 26, of a common bridge circuit 28. Each of the first 24 and second 26 voltage divider branches comprises an own pair 30, 32, respectively 34, 36, of micro-strip lines connected in series. Each of the first 24 and second 26 voltage divider branches has an own tap C, D. Both taps C, D are connected to each other by at least one of a first capacity 42 and/or a micro-strip line. The differential output 14, 15 is designed to provide a first OUTX and a second OUT output signal (see FIG. 5, 6). The first output terminal 14 is connected via the first output circuit 16 to a first node A. The second output terminal 15 is connected via the second output circuit 18 to a second node B. Each of the first A and second B nodes of the push-push oscillator 12 is a common node of both of the first 20 and second 22 branch.

Figure 14:
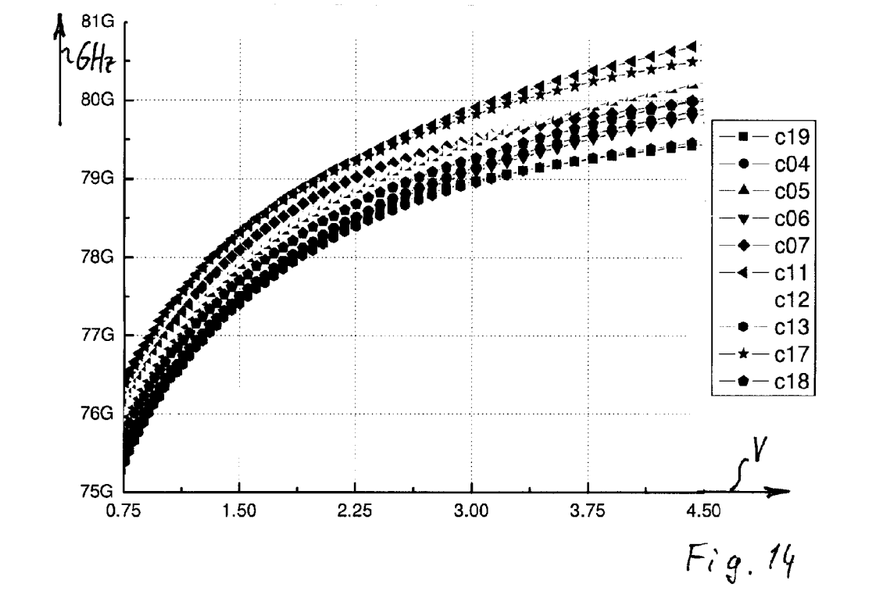
FIG. 14 shows for an example embodiment a measurement result of the tuning range of the oscillator.
Figure 15:
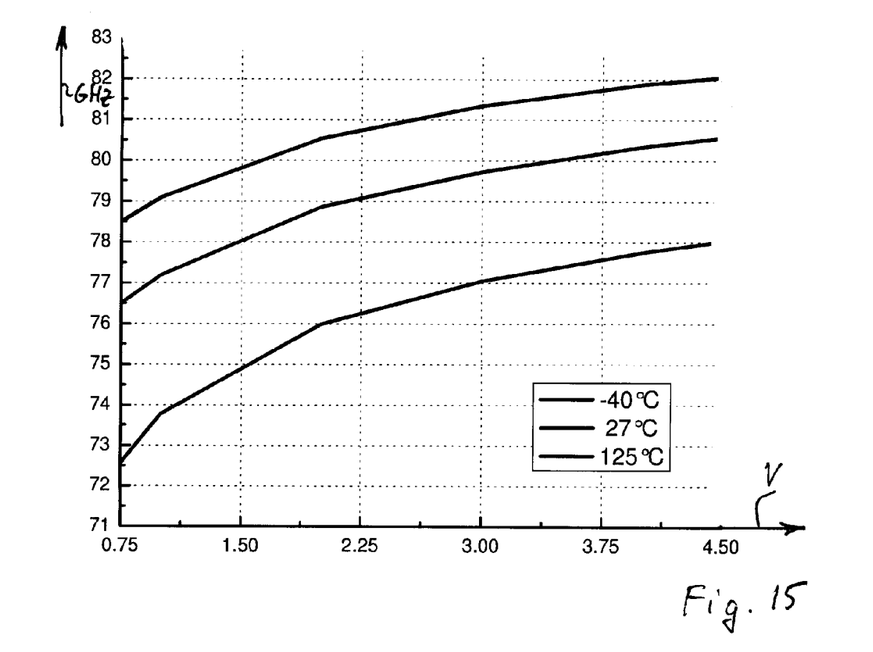
FIG. 15 shows for an example embodiment a measurement result of the temperature drift of the tuning range of the oscillator.

The common bridge circuit 28 has a resonance at an output oscillation frequency at $2\omega_{RF}$, which is the desired output frequency, and which is an integer multiple of the fundamental oscillation frequency $\omega_{RF}$ of the push-push oscillator 12. The common bridge circuit 28 is used to achieve maximum efficiency at the output oscillation frequency $2\omega_{RF}$ and to transform input impedance. In the example embodiment, the output oscillation frequency $2\omega_{RF}$ is twice as high as the fundamental oscillation frequency $\omega_{RF}$. Within the first branch 20 of the push-push oscillator 12 a micro-strip line 43 is arranged between a resonance circuit 59 of the push-push oscillator core 60 and the first node A. Within the second 22 branch of the push-push oscillator 12 a micro-strip line 45 is arranged between the resonance circuit 59 of the push-push oscillator core 60 and the first node A. Each of the micro-strip lines 43, 45 has a length of an uneven integer multiple of a quarter wave length of the fundamental oscillation frequency $\omega_{RF}$ of the push-push oscillator core 60. Each of the first 20 and the second branch 22 of the push-push oscillator 12 comprises exactly one transistor stage T1 respectively T2. Both transistor stages T1, T2 have an identical structure. The push-push oscillator 12 is a voltage-controlled push-push oscillator 12. The push-push oscillator 12 has at least one variable-capacitance diode 44, 46. For tuning, an adjustable bias is applied to the variable-capacitance diodes 44, 46 via a tuning terminal 61 and a micro-strip line 63 (see FIGS. 14, 15, 17). Micro-strip line 63 has a length of an uneven integer multiple of a quarter wave length of the fundamental oscillation frequency $\omega_{RF}$ of the push-push oscillator core 60. The micro-strip lines 72, 74 are interconnection lines which can be short.

The base terminals 48, 49 (respectively gate terminals 48, 49) of both transistor stages T1, T2 are connected by a third branch 50, which forms a part of the resonator circuit 59 of the push-push oscillator core 60. The third branch 50 comprises two micro-strip lines 52, 54 in series. Thus, the two micro-strip lines 52, 54 are part of the resonator 59. A further micro-strip line 56 is connected to a tap 58 of the third branch 50. The micro-strip line 56 has a length of an uneven integer multiple of a quarter wave length of the fundamental oscillation frequency $\omega_{RF}$ of the oscillator core 60. The micro-strip line 56 is terminated by a second capacity 58 via which the push-push oscillator 12 can be activated and deactivated by a first control signal $V_{CTRL}$. The oscillator circuit 10 is designed to be supplied by a voltage source Vcc, in particular by a DC voltage source.

Figure 10:
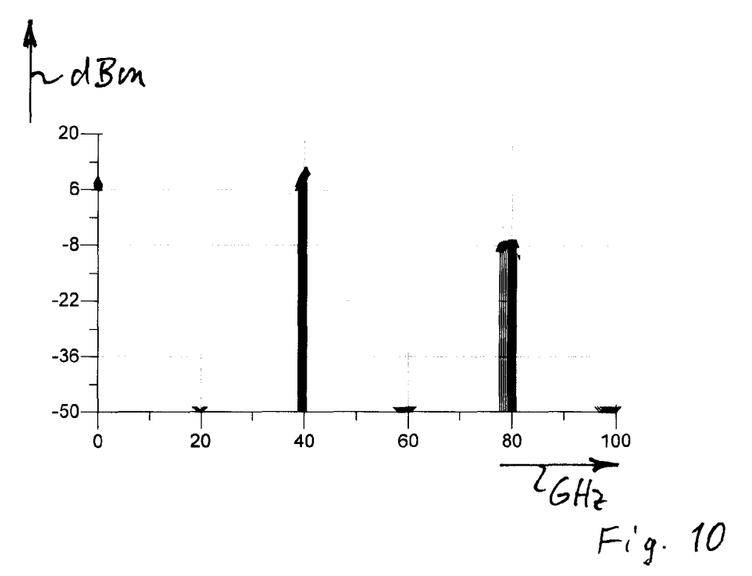
FIG. 10 shows for an example embodiment a simulation result of a power spectrum at the emitter of transistor stage T1.
Figure 11:
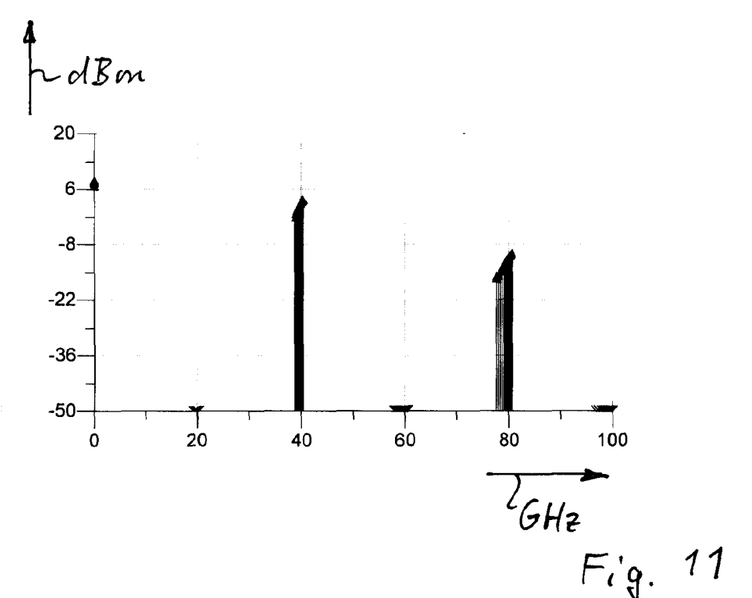
FIG. 11 shows for an example embodiment a simulation result of a power spectrum between transistor stage T1 and a point A (closer to the emitter of T1).
Figure 13:
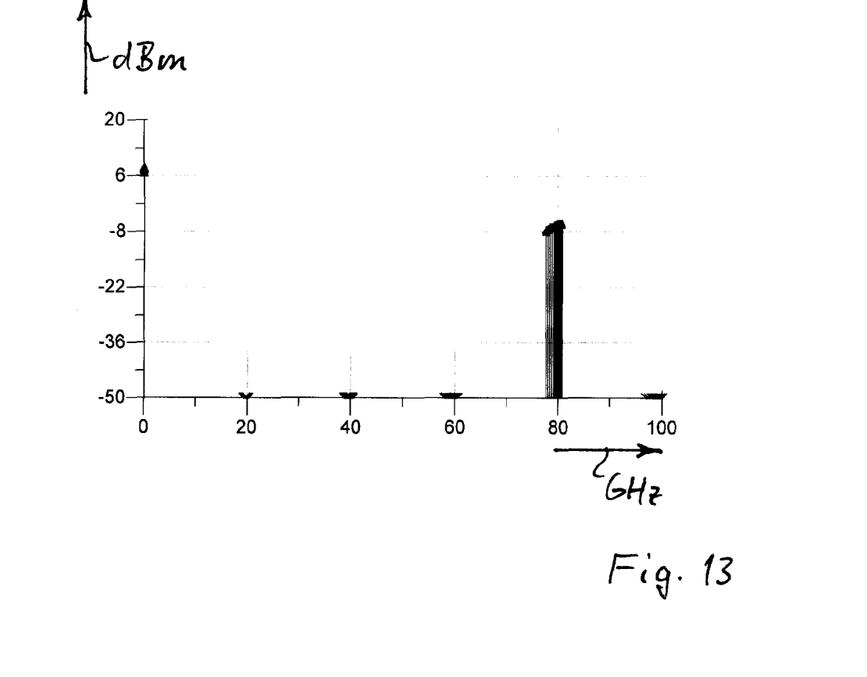
FIG. 13 shows for an example embodiment a simulation result of a power spectrum at the point A.

The oscillator core 60 does not only generate but also harmonics of the fundamental oscillation frequency $\omega_{RF}$ (see FIG. 10). Thereof, the second harmonic $2\omega_{RF}$ is filtered in the common bridge circuit 28. The suppression of the fundamental oscillation frequency $\omega_{RF}$ at the output 14, 15 is high, due to micro-strip lines 43 and 45 (see FIG. 13). The suppression of the fundamental oscillation frequency $\omega_{RF}$ is still good in case of mismatch.

In practice, the signals at the nodes A and B do not have exactly 180° phase difference. The micro-strip lines 62, 64 are optimized to convey differential balanced signals at the output oscillation frequency $2\omega_{RF}$ (see FIGS. 5, 6). The phase balance of the differential signals can be improved by adjusting the length (phase shift) of the micro-strip lines 62 and 64.

Figure 2:
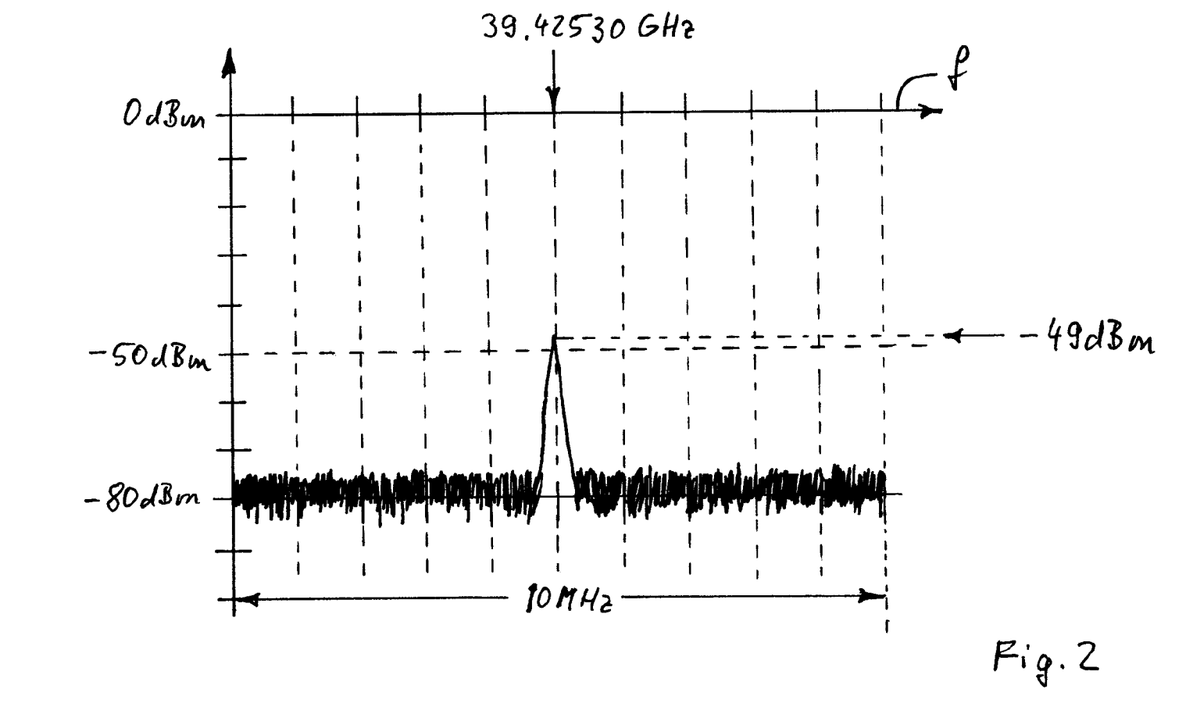
FIG. 2 shows for an example embodiment a measurement result of the suppression of the fundamental signal of the oscillator.
Figure 12:
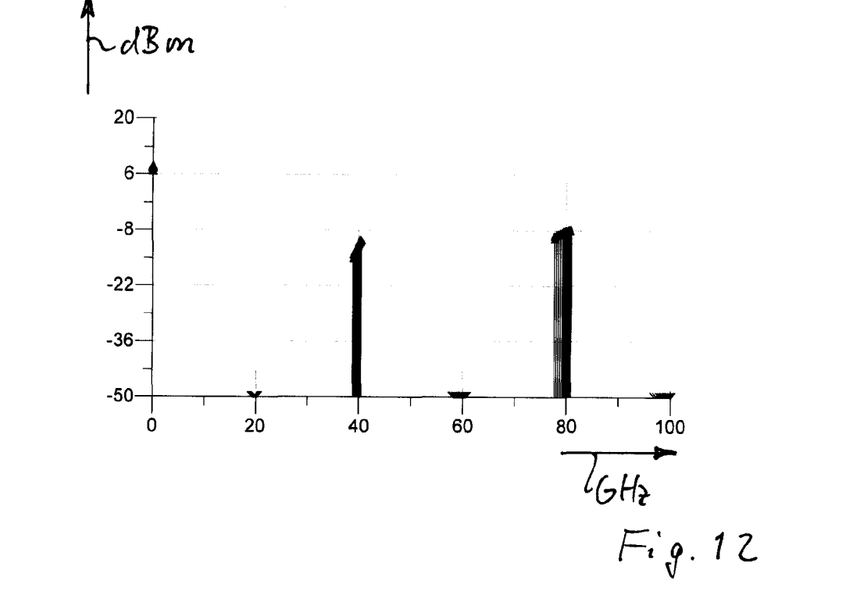
FIG. 12 shows for an example embodiment a simulation result of a power spectrum between transistor stage T1 and the point A (closer to the point A).

Summarized, an oscillator core 60 running at half of the wanted output oscillation frequency $2\omega_{RF}$ has been designed (see FIG. 2). A buffer or a doubler stage may be connected to the output terminals 14, 15 of the push-push oscillator 12. From the oscillator core 60 a differential push-push signal at half of the desired output oscillation frequency $2\omega_{RF}$ is obtained (see FIG. 10). The second harmonic $2\omega_{RF}$ of the fundamental oscillation of the oscillator core 60 provides a differential signal at the output oscillation frequency $2\omega_{RF}$, which is provided at common-mode nodes A, B of the push-push oscillator 12 without additional doublers and without substantially loading the oscillator core 60 (see FIG. 13). This method of frequency doubling is different to that of a conventional circuit as described by US 2007/0182502 A1, wherein a frequency doubling is performed by adding curves of lower frequency signals fed from two branches at common nodes, which are similar to nodes A and B of the present invention. With the present invention however, the signal having the fundamental oscillation frequency $\omega_{RF}$ is forced into the common bridge 28 acting as resonator for obtaining the second harmonic $2\omega_{RF}$. Nevertheless, a small portion of the differential signal at the fundamental oscillation frequency $\omega_{RF}$ is following the behavior of the conventional circuit mentioned before. Therefore, the intensity of the spectral line at point A having the output oscillation frequency $2\omega_{RF}$ at about 77 GHz (see FIG. 13) is slightly increased in comparison to the corresponding spectral line at the emitter of transistor T1 (see FIG. 10). With the present invention, the suppression of the fundamental signal at $\omega_{RF}$ at about 38 GHz is improved due to the micro-strip lines 43, 45 (compare FIG. 13 with FIG. 12).

This benefit particularly also applies in case of mismatch, because—with the circuit according to the present invention—an adding of the curves of the fundamental frequency signals cannot efficiently result in a large feedthrough to the output terminals 14, 15 of signals having the fundamental frequency $\omega_{RF}$.

Figure 3:
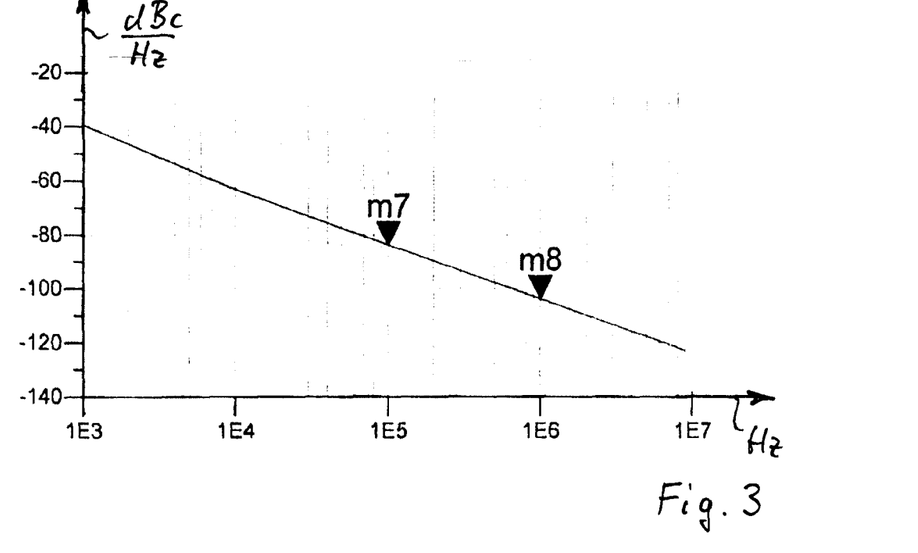
FIG. 3 shows for an example embodiment a simulation result for phase noise at the output of the core of the oscillator at 81.29 GHz and 25° C.
Figure 4:
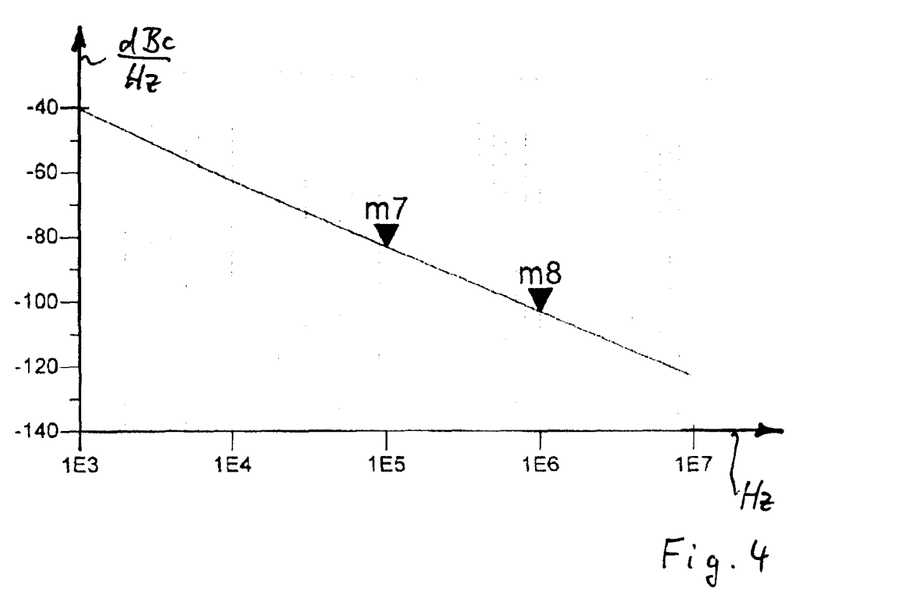
FIG. 4 shows for an example embodiment simulation result for phase noise at the output of the core of the oscillator at 80.23 GHz and 125° C.

Typically, the oscillator 12 is a voltage-controlled oscillator (VCO). Only npn devices T1, T2 are used for generating the push-push output OUTX, OUT. Contrary to US 2007/0182502 A1, no complementary devices are used for generating the push-push output OUTX, OUT. A phase of the output signals OUTX, OUT is adjusted by transmission lines 62, 64. The phase noise of the oscillator core 60 is reduced by adequately tuned transmission lines. The phase noise is at least about 5 dB lower than with conventional oscillators (see FIGS. 3, 4). As neither a quadrature oscillator nor a separate stand-alone frequency doubler is needed, the oscillator circuit 10 according to the invention has the benefit, that a small chip size, a cost-efficient design, a simple layout, and low current drain are possible.

Figure 16:
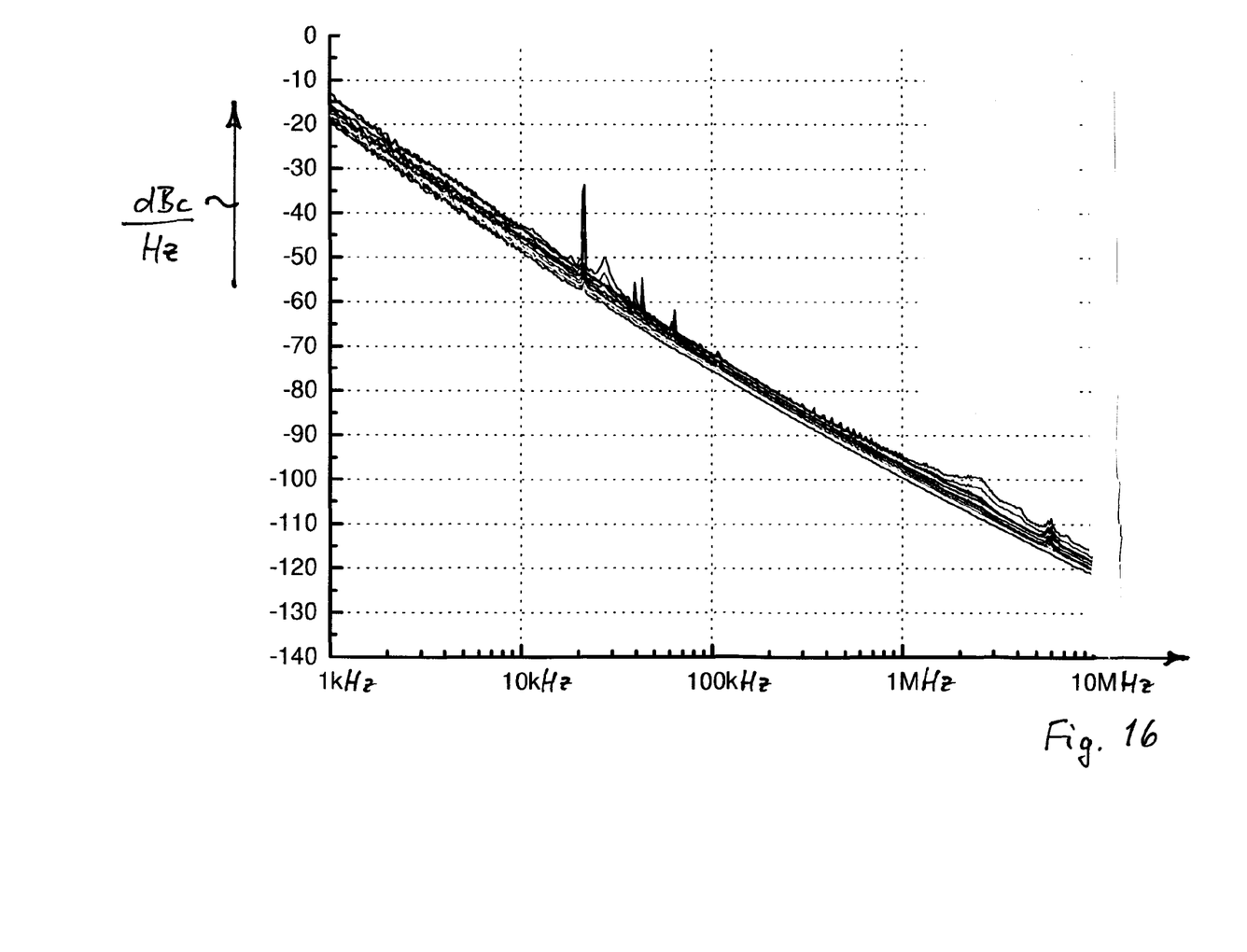
FIG. 16 shows for an example embodiment a measurement result of the single-side band phase noise of the oscillator versus offset frequency.
Figure 17:
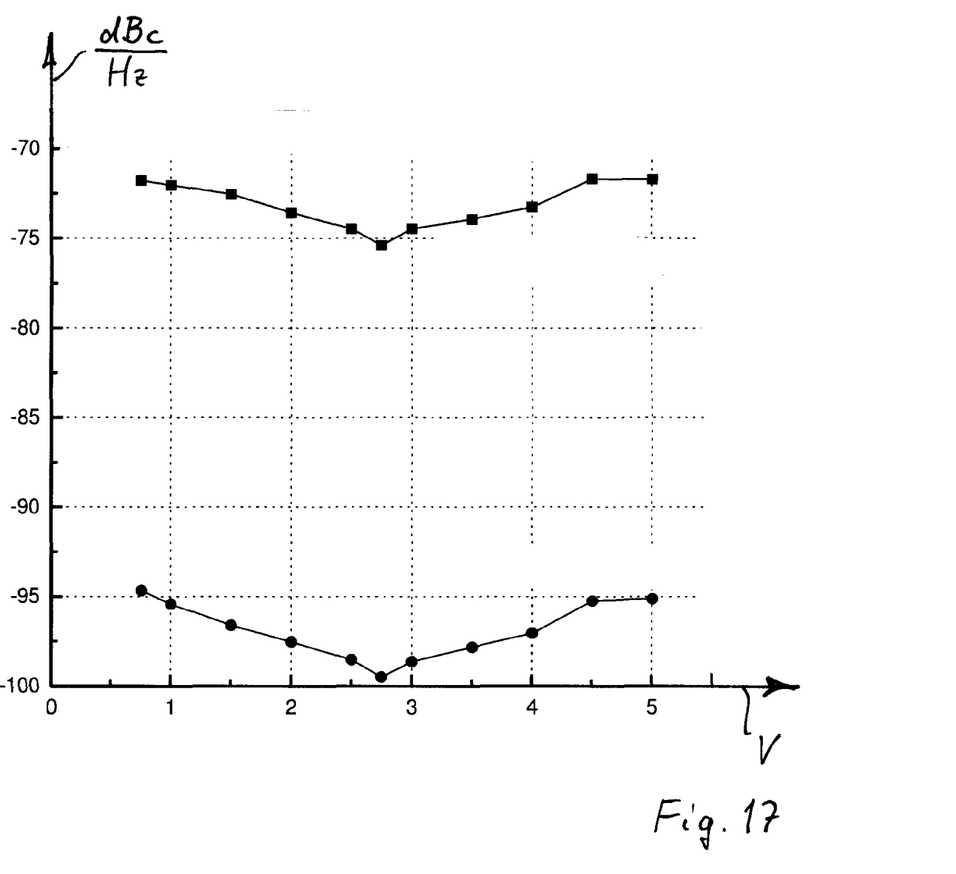
FIG. 17 shows for an example embodiment a measurement result of the single-side band phase noise versus tuning range.

$V_{CTRL}$ is an input/output pin. It is used to monitor in a test version the bias point of the devices T1, T2. Usually, the bias point is changed to find the best phase noise. It can also be used to switch off the oscillator 12. The resistor 66 is used for biasing the circuit 10. The micro-strip lines 68, 70 decouple the RF path from the DC path. Each of the micro-strip lines 68, 70 has a length of an uneven integer multiple of a quarter wave length of the desired output oscillation frequency $2\omega_{RF}$. The transistors T1 and T2 are working as active devices of the oscillator 12. The current density needed for devices T1, T2 which run at half of the output frequency $2\omega_{RF}$ is much lower than in the case when they were used in an oscillator running directly at the output oscillation frequency $2\omega_{RF}$ needed. Since lower current density means lower 1/f noise in the devices T1, T2, this results in a lower phase noise. An improvement of 4 to 7 db less phase noise has been measured in comparison to a conventional oscillator circuit designed with the same technology (see FIG. 16). FIG. 17 shows for an example embodiment a measurement result of the single-side band phase noise versus tuning range at 100 kHz offset (upper curve) and at 1 MHz offset (lower curve).

The oscillator circuit according to the present invention can be implemented in a great variety of semiconductor technologies, which does not apply to prior art circuits, as described in US 2007/0182502. Among other, the invention can be implemented in CMOS, NMOS, PMOS, and NPN bipolar technologies.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner.

Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An oscillator circuit comprising:
   a push-push oscillator, wherein
      the push-push oscillator has a first and a second branch,
      each of the first and second branch comprises a voltage divider branch of a common bridge circuit,
      each of the first and second voltage divider branches comprises a pair of micro-strip lines connected in series,
      each of the first and second voltage divider branches has a tap, and
      both taps are connected to each other by at least one of a first capacity and a micro-strip line;
   a differential output comprising a first and a second output terminal, wherein
      the first output terminal is connected to a first node and the second output terminal is connected to a second node, and
      each of the first and second nodes of the push-push oscillator is a common node of both of the first and second branches; and
   a first output circuit for the first output terminal and a second output circuit for the second output terminal.

2. The oscillator circuit according to claim 1, wherein the common bridge circuit has a resonance at an output oscillation frequency, which is an integer multiple of a fundamental oscillation frequency of the oscillator.

3. The oscillator circuit according to claim 2, wherein the output oscillation frequency is twice as high as the fundamental oscillation frequency.

4. The oscillator circuit according to claim 1, wherein
   within each of the first and second branches of the push-push oscillator a micro-strip line is arranged between a resonance circuit of the push-push oscillator and the first node, which is common to both of the first and second branches, wherein
   the micro-strip line has a length of an uneven integer multiple of a quarter wave length of a fundamental oscillation frequency of the push-push oscillator.

5. The oscillator circuit according to claim 1, wherein each of the first and the second branch of the push-push oscillator comprises exactly one transistor stage, wherein both transistor stages have an identical structure.

6. The oscillator circuit according to claim 1, wherein the push-push oscillator is a voltage-controlled push-push oscillator.

7. The oscillator circuit according to claim 1, wherein the push-push oscillator has at least one variable-capacitance diode.

8. The oscillator circuit according to claim 5, wherein the gate terminals of both transistor stages are connected by a third branch, wherein the third branch comprises two micro-strip lines.

9. The oscillator circuit according to claim 8, wherein a micro-strip line is connected to a tap of the third branch, wherein the micro-strip line is terminated by a second capacity via which the push-push oscillator can be activated and deactivated by a first control signal.

10. The oscillator circuit according to claim 1, wherein the oscillator circuit is designed to be supplied by a voltage source.

11. The oscillator circuit according to claim 4, wherein each of the first and the second branch of the push-push oscillator comprises exactly one transistor stage, wherein both transistor stages have an identical structure.

12. The oscillator circuit according to claim 4, wherein the push-push oscillator is a voltage-controlled push-push oscillator.

13. The oscillator circuit according to claim 5, wherein the push-push oscillator is a voltage-controlled push-push oscillator.

14. The oscillator circuit according to claim 4, wherein the push-push oscillator has at least one variable-capacitance diode.

15. The oscillator circuit according to claim 5, wherein the push-push oscillator has at least one variable-capacitance diode.

16. The oscillator circuit according to claim 13, wherein the gate terminals of both transistor stages are connected by a third branch, wherein the third branch comprises two micro-strip lines.

17. The oscillator circuit according to claim 15, wherein the gate terminals of both transistor stages are connected by a third branch, wherein the third branch comprises two micro-strip lines.

* * * * *